US007606034B2

(12) United States Patent
Paul et al.

(10) Patent No.: US 7,606,034 B2
(45) Date of Patent: Oct. 20, 2009

(54) THERMALLY ENHANCED MEMORY MODULE

(75) Inventors: Andy Paul, San Francisco, CA (US);
Dan Solvin, Fremont, CA (US); Don Lieberman, San Jose, CA (US); John S. Beekley, Danville, CA (US); Martin E. Mueller, Fremont, CA (US); Robert Pearce, Fremont, CA (US)

(73) Assignee: Corsair Memory, Fremont, CA (US)

( * ) Notice: Subject to any disclaimer, the term of this patent is extended or adjusted under 35 U.S.C. 154(b) by 0 days.

(21) Appl. No.: 11/757,977

(22) Filed: Jun. 4, 2007

(65) Prior Publication Data

US 2007/0285898 A1 Dec. 13, 2007

Related U.S. Application Data

(60) Provisional application No. 60/811,317, filed on Jun. 5, 2006.

(51) Int. Cl.
*H05K 7/20* (2006.01)
(52) U.S. Cl. ............. 361/715; 361/704; 361/719; 361/720; 257/712; 165/80.3
(58) Field of Classification Search ............ None
See application file for complete search history.

(56) References Cited

U.S. PATENT DOCUMENTS

| | | | | |
|---|---|---|---|---|
| 5,258,887 A | * | 11/1993 | Fortune | 361/720 |
| 5,461,201 A | * | 10/1995 | Schonberger et al. | 174/16.3 |
| 5,608,610 A | * | 3/1997 | Brzezinski | 361/704 |
| 6,114,413 A | | 9/2000 | Kang et al. | 523/200 |
| 6,212,076 B1 | | 4/2001 | MacQuarrie et al. | 361/720 |
| 6,462,410 B1 | * | 10/2002 | Novotny et al. | 257/707 |
| 6,477,054 B1 | * | 11/2002 | Hagerup | 361/720 |
| 6,605,778 B2 | * | 8/2003 | Dorfler et al. | 174/524 |
| 6,657,864 B1 | * | 12/2003 | Dyckman et al. | 361/704 |
| 6,661,661 B2 | * | 12/2003 | Gaynes et al. | 361/705 |
| 6,922,338 B2 | * | 7/2005 | Poechmueller | 361/719 |
| 7,064,963 B2 | * | 6/2006 | Oman et al. | 361/792 |
| 7,215,547 B2 | * | 5/2007 | Chang et al. | 361/701 |
| 7,251,138 B2 | * | 7/2007 | Hornung et al. | 361/704 |
| 7,269,017 B2 | * | 9/2007 | Berlin et al. | 361/719 |
| 2006/0006525 A1 | * | 1/2006 | Mullen et al. | 257/712 |
| 2006/0104035 A1 | * | 5/2006 | Vasoya et al. | 361/704 |
| 2007/0195505 A1 | * | 8/2007 | Savignac et al. | 361/719 |

FOREIGN PATENT DOCUMENTS

GB 2274738 A 8/1994

OTHER PUBLICATIONS

International Search Report and Written Opinion issued to applicant Corsair Memory on Feb. 12, 2008 in PCT Application PCT/US07/70446.

* cited by examiner

*Primary Examiner*—Boris L Chervinsky
(74) *Attorney, Agent, or Firm*—Carina M. Tan; Reed Smith LLP (57) ABSTRACT

A thermally enhanced memory module is claimed. The memory module includes a first extended electrical plane, and a thermal connection between a surface plane of its substrate and the first extended electrical plane. A first thermal management, such as a heat spreader, is coupled to the surface plane of the substrate and to the thermal connection.

12 Claims, 9 Drawing Sheets

THERMALLY ENHANCED MEMORY MODULE

RELATED APPLICATIONS

This application is related to and claims priority to Provisional U.S. Patent Application No. 60/811,317, filed Jun. 5, 2006, which application is incorporated by reference herein in its entirety.

TECHNICAL FIELD

The disclosed embodiments relate generally to the field of memory modules. More particularly, the present invention relates to removing heat from such modules.

BACKGROUND

Higher operating temperature typically has a negative impact on both performance and reliability of semiconductor memory devices, which operate more slowly at higher temperature, and fail more frequently at higher temperatures. In addition, as semiconductor memory devices (referred to as "device" or "memory device" herein) operate at higher speeds or frequencies, they tend to consume more power. The increase in consumption of power can cause operating temperature to further increase, thus additionally affecting performance and reliability.

According to one approach, a heat spreader or heat sink can be used to mitigate the rise in device operating temperatures. The heat spreader is typically mounted directly on the top surface of a device, or devices. The heat spreader provides a conductive path to a larger radiating surface area. The larger radiating surface area makes air cooling more effective since there is a larger surface area for the heat to dissipate from into the air.

The method of applying a heat spreader to the surface of the device has the benefit of being very easy to install. Typically, heat spreaders are applied via an adhesive, or held in place via a clamp onto the top surface of the device. In addition, for a relatively low added cost, heat spreaders prove to be an effective method of improving the thermal performance of a device.

The drawback of applying a heat spreader to the surface of the device is that improvements in the thermal path are made only to the heat paths through the top surface of the device package. Thermal paths through the package leadframe/substrate are not improved. The package leadframe/substrate thermal path can be equally critical to the device thermal performance as the top surface path. Therefore, any improvements to the package leadframe/substrate thermal path can significantly improve thermal performance.

DESCRIPTION OF EMBODIMENTS

Figure 1:
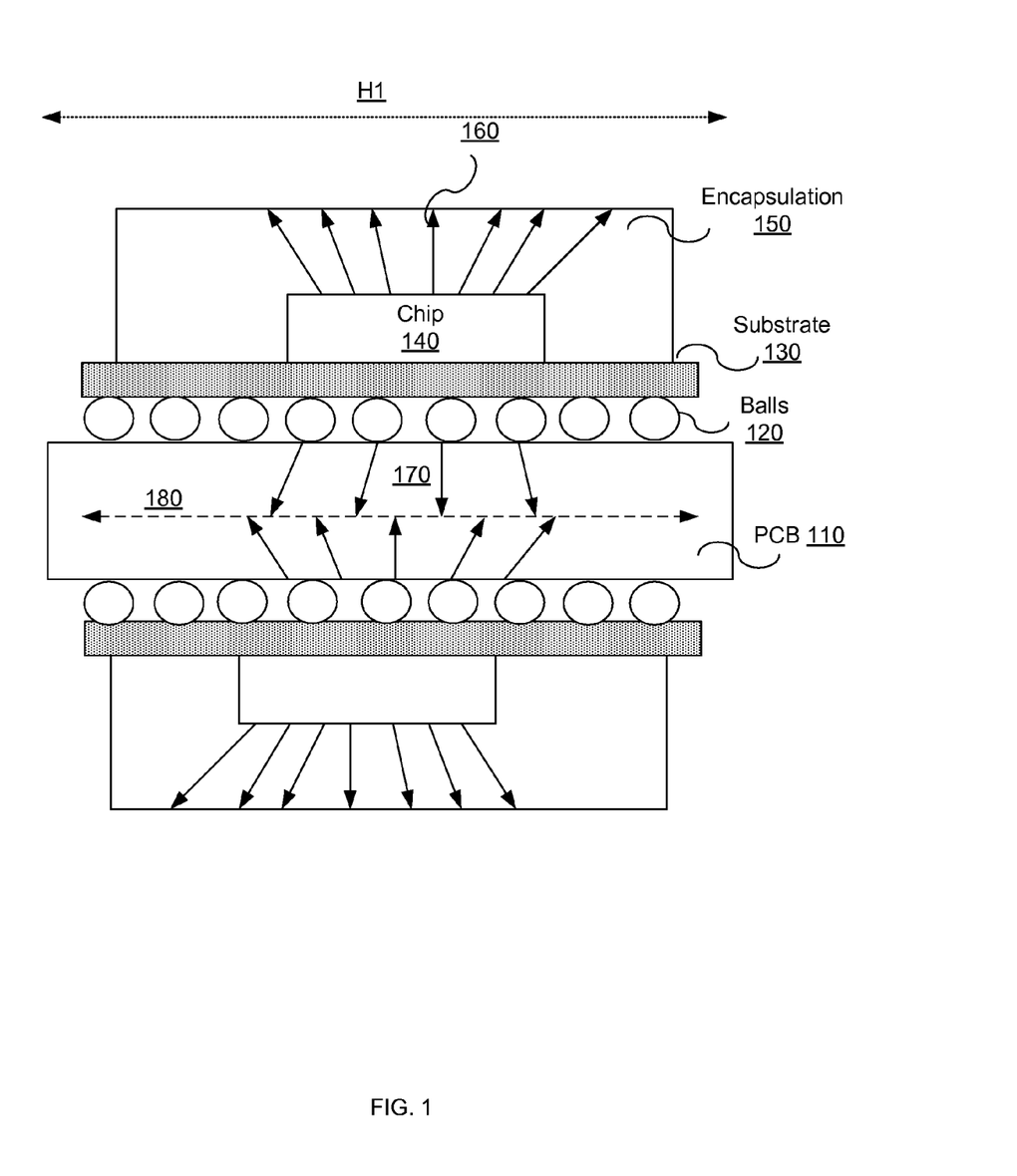
FIG. 1 illustrates heat paths from a memory module 100.

FIG. 1 illustrates paths for heat dissipation for heat generated in memory module 100. Memory module 100 includes one or more semiconductor memory devices 140 bonded to substrate 130. Semiconductor memory device 140 may be silicon or some other semiconductor material. Substrate 130 may typically be made of ceramic or some type of organic packaging. Substrate 130 is disposed upon a printed circuit board (PCB) 110 and electrically connected thereto with conductive balls 120. Semiconductor memory device 140 may be protected by an encapsulate 150 (typically plastic) applied over the surface of substrate 130.

As indicated by arrows 160, heat paths allow heat to dissipate through the package body to the surface of the package. The heat from the surface of the package is radiated into the surrounding environment. However, the effectiveness of this thermal path in air cooled applications is limited by the poor thermal conductivity of air and the total radiating surface of the device package 150.

As indicated by arrows 170, heat from the leadframe (for a Thin Small Outline Package (TSOP)) or substrate (for a Ball Grid Array (BGA) style package) is conducted into power planes of PCB substrate 110. Unfortunately, the power planes are typically embedded around the middle of PCB 110, as illustrated by dashed line 180. Further, as depicted in FIG. 1, PCB 110 has a first height—H1.

Figure 2:
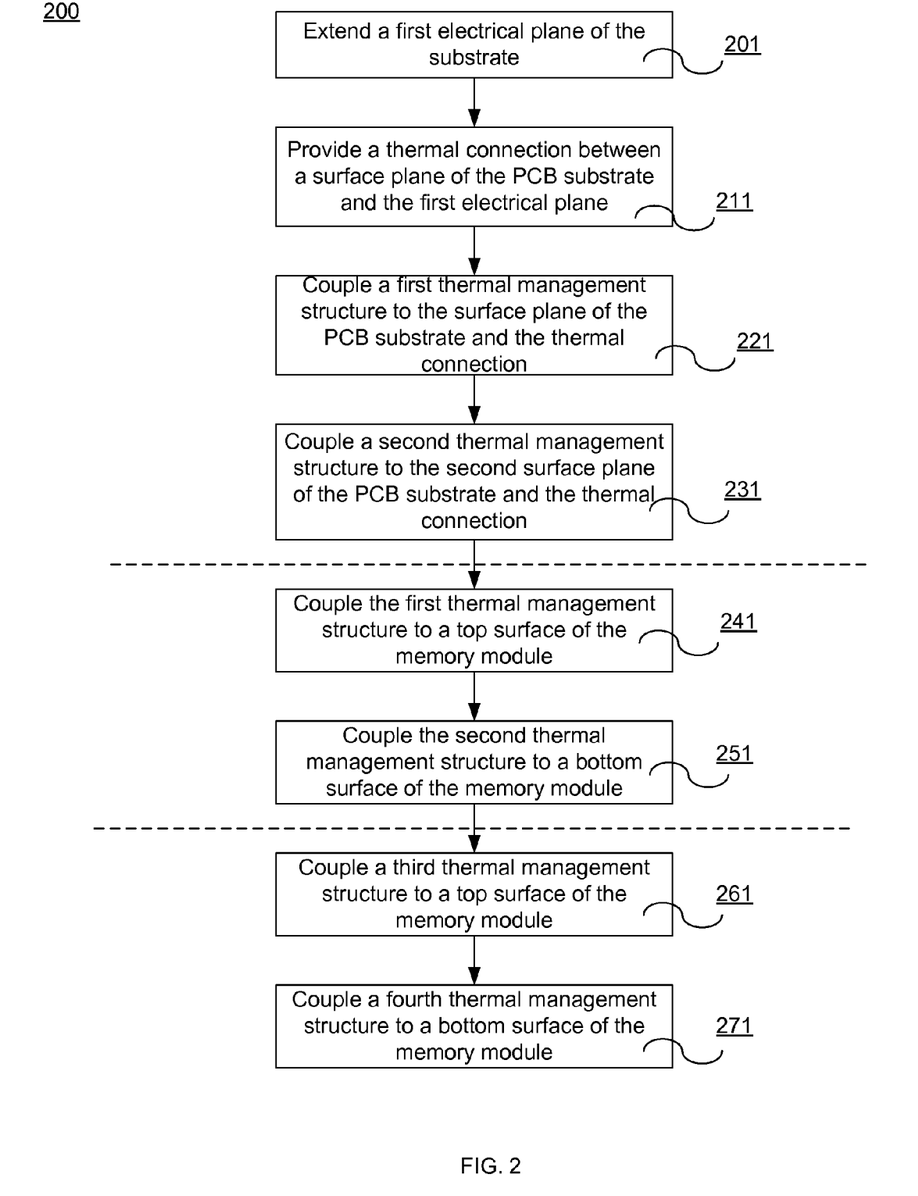
FIG. 2 is a flow diagram illustrating a process 200 of removing heat from a memory module according to an embodiment of the invention.

FIG. 2 is a flow diagram of a method 200 to thermally enhance a memory module. According to an embodiment, the performance of the thermal path through the device leadframe/substrate into the substrate power planes is improved by mounting a heat spreader directly to the planes of the PCB substrate.

At block 201, a first electrical plane of the PCB substrate is extended. In one embodiment, the first electrical plane is a ground plane. At block 211, a thermal connection between a surface plane of the PCB substrate and the first electrical plane is provided. In one embodiment, the thermal connection is provided by vias. Vias are discussed further with reference to FIG. 3. At block 221, a first thermal management structure is coupled to a first surface plane of the PCB substrate and the thermal connection. At block 231, a second thermal management structure is coupled to a second surface plane of the PCB substrate and the thermal connection. This is discussed further with reference to FIG. 4.

In one embodiment, optionally at blocks 241 and 251 respectively, the first thermal management structure is coupled to a top surface of the memory module and the second thermal management structure is coupled to a bottom surface of the memory module. This is discussed further with reference to FIG. 6.

In one embodiment, optionally at blocks 261 and 271 respectively, a third thermal management structure is coupled to a top surface of the memory module and a fourth thermal management structure is coupled to a bottom surface of the memory module. This is discussed further with reference to FIGS. 5, 7 and 8.

Figure 3A:
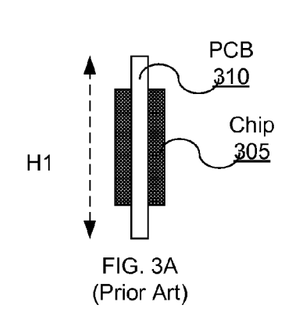
FIGS. 3A-3C are diagrams illustrating vias made in PCB of a memory module.
Figure 3B:
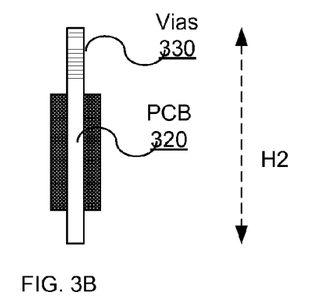

FIG. 3A illustrates a cross-sectional view of a prior art PCB 310. In contrast, FIG. 3B illustrates a cross-sectional view of a PCB 320 according to an embodiment of the invention. The height H2 of PCB 320 is greater than the height H1 of PCB 310 to accommodate the extended electrical planes of PCB 320. Further, PCB 320 has vias 330. Vias 330 are further illustrated in FIG. 3C, which is a top view of PCB 320, on which a plurality of devices 340 is mounted.

Figure 3C:
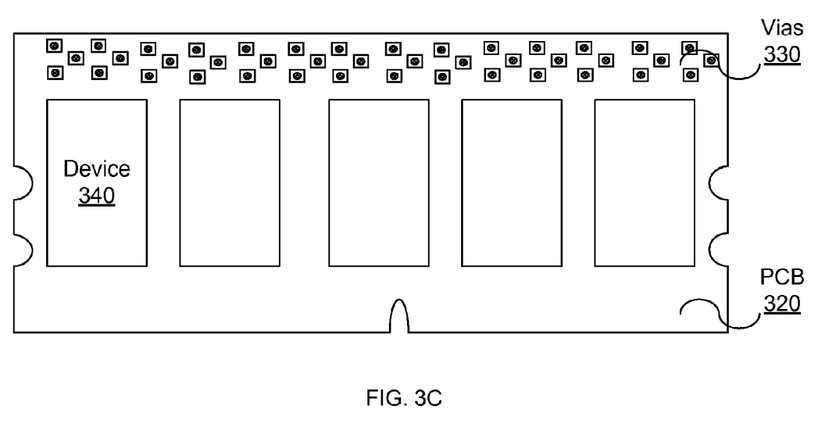

According to one embodiment of the invention, one or more electrical layers of PCB 320 are connected to a surface layer or plane using vias 330. Vias 330 are drilled and plated holes that connect one or more electrical layers of PCB 320. In one embodiment, vias 330 provide both an electrical and a thermal connection between a surface plane on each side of substrate and one or more internal electrical layers (e.g., 180) of PCB 320 that exist in or around the middle of substrate, such as an internal ground plane.

Figure 4:
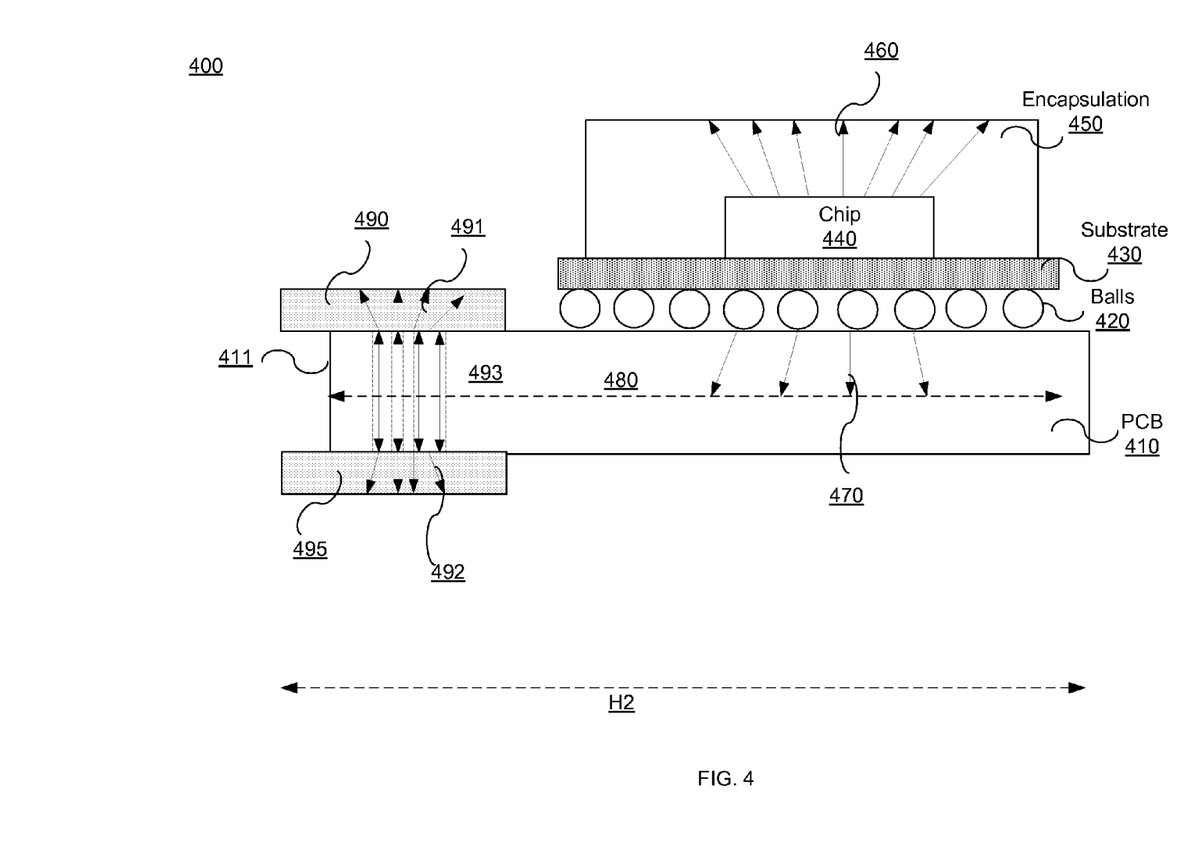
FIG. 4 is a block diagram illustrating a thermally enhanced memory module 400 according to an embodiment of the invention.

FIG. 4 illustrates a thermally enhanced memory module 400 according to an embodiment of the invention. Memory module 400 is similar to memory module 100, except in that the height of PCB 410 has been increased from a height H1 to a height H2. As depicted in FIG. 4, one or both of substrate heat spreaders 490 and 495 are mounted to one or more internal electrical layers (e.g., 480) of PCB 410, which exist in or around the middle of the PCB 410. In one embodiment, one or both of heat spreaders 490 and 495 are mounted to the ground plane of PCB 410. Further, as shown in FIG. 4, a part of substrate heat spreaders 490 and 495 extends above a top edge 411 of PCB 410.

Substrate heat spreaders 490 and 495 are mounted directly on the surface of PCB 410 in direct contact with a surface plane and thermal vias (shown as dotted lines) connected to the substrate ground plane. Substrate heat spreaders 490 and 495 can be bonded onto each side of PCB 410 respectively either with an adhesive bond (such as, thermally conductive epoxy), or can be soldered to PCB 410. Substrate heat spreaders 490 and 495 are in direct contact with the thermal vias and surface plane of the PCB substrate 410.

As indicated by arrows 470, heat from the leadframe or substrate 430 is conducted into internal electrical power planes (indicated by dotted line 480) that are embedded in or around the middle of PCB 410. Further, as indicated by arrows 491, 492 and 493, heat from electrical power planes (indicated by dotted line 480) is dissipated into the heat spreaders 490 and 495 mounted on substrate using the thermal connection provided by vias (shown as dotted lines).

Figure 5:
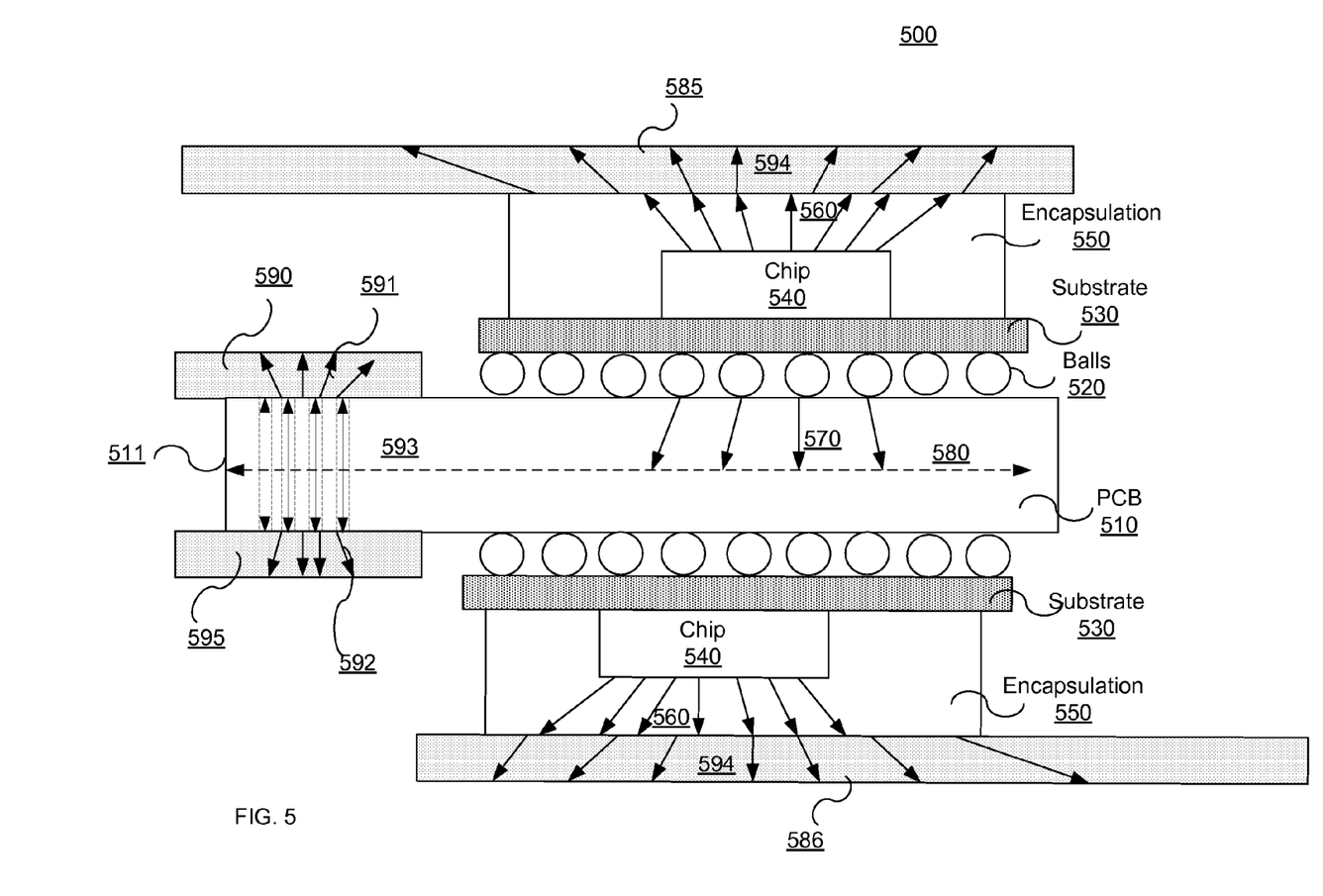
FIG. 5 is a block diagram illustrating a thermally enhanced memory module 500 according to an embodiment of the invention.

FIG. 5 illustrates a thermally enhanced memory memory module 500 according to an embodiment of the invention. Memory module 500 is similar to memory module 400, except in that memory module 500 further includes a surface heat spreader 585. Arrows 594 indicate heat paths from memory module surface to surface heat spreader 585. Heat generated by memory device(s) 540 is dissipated into encapsulation 550, as indicated by arrows 560. Surface heat spreader 585 radiates heat from the surface of encapsulation 550 into the surrounding environment, as indicated by arrows 594. Surface heat spreader 585 is coupled directly to the top surface of the memory module 500 and can provide a conductive path to a larger radiating surface area. This can make air cooling more effective because there is a larger surface area for the heat to dissipate from into the air. Surface heat spreader 585 can be coupled to surface of the memory module 500 using an adhesive, or can be held in place via a clamp. Further, in one embodiment, as depicted in FIG. 5, surface heat spreaders 586 can be mounted on the other side (a bottom surface) of memory module 500 as well.

Figure 6:
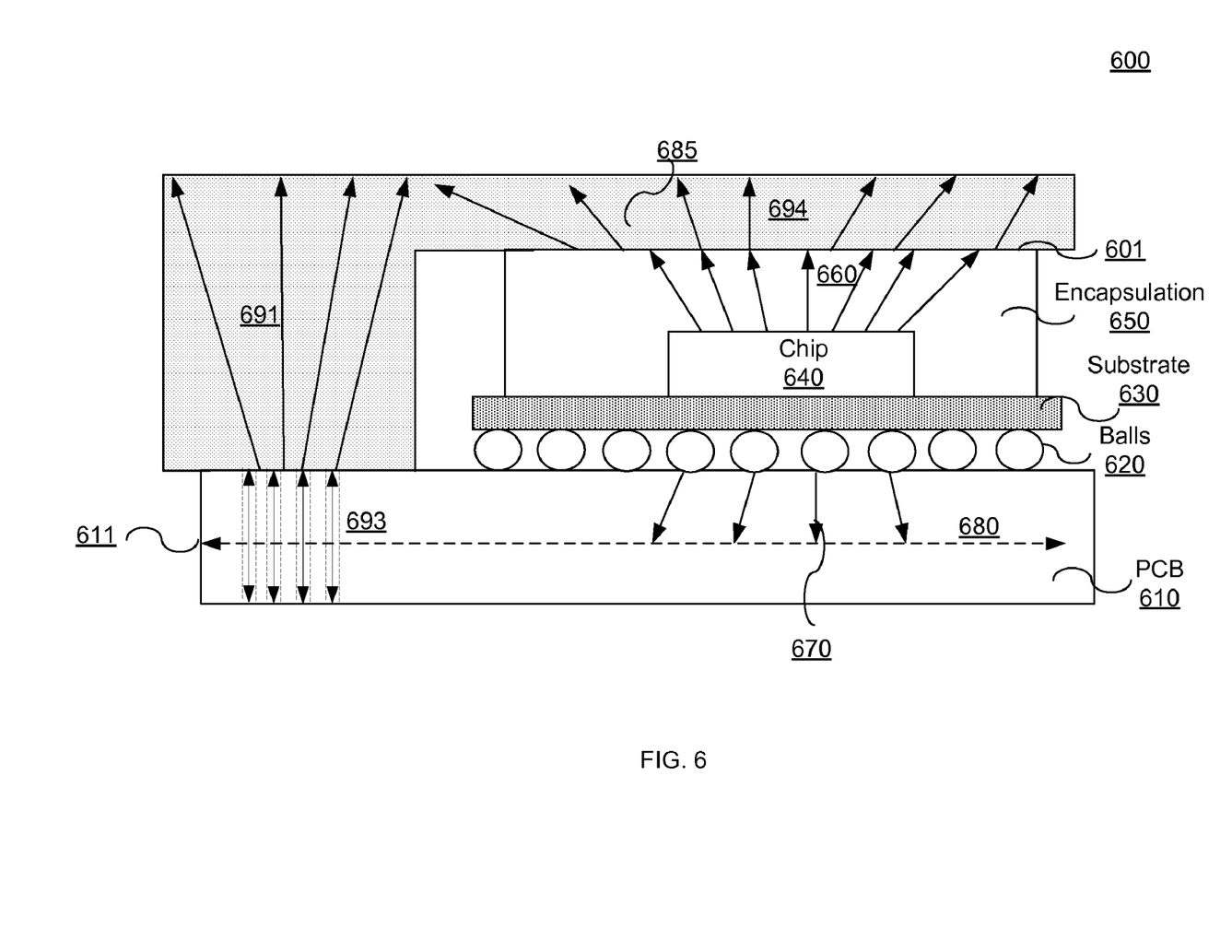
FIG. 6 is a block diagram illustrating a thermally enhanced memory module 600 according to an embodiment of the invention.

FIG. 6 illustrates a thermally enhanced memory module 600 according to an embodiment of the invention. Memory module 600 is similar to memory module 500, except in that package 600 includes a single heat spreader 685. Heat spreader 685 is used to connect to both the encapsulation 650 surface and the PCB substrate 610 surface. Heat spreader 685 dissipates heat from package surface (as indicated by arrows 660 and 694). Heat spreader 685 also dissipates the heat from the leadframe or PCB substrate 610 that is conducted into internal electrical power planes (indicated by dotted line 680) that are embedded in or around the middle of PCB 610 (as indicated by heat paths 670, 693 and 691). In the embodiment shown in FIG. 6, heat spreader 685 couples to a top surface 601 of memory module 600. Although not depicted in FIG. 6, another heat spreader can also be coupled to a bottom surface of memory module 600 and to the PCB substrate 610 surface.

Figure 7:
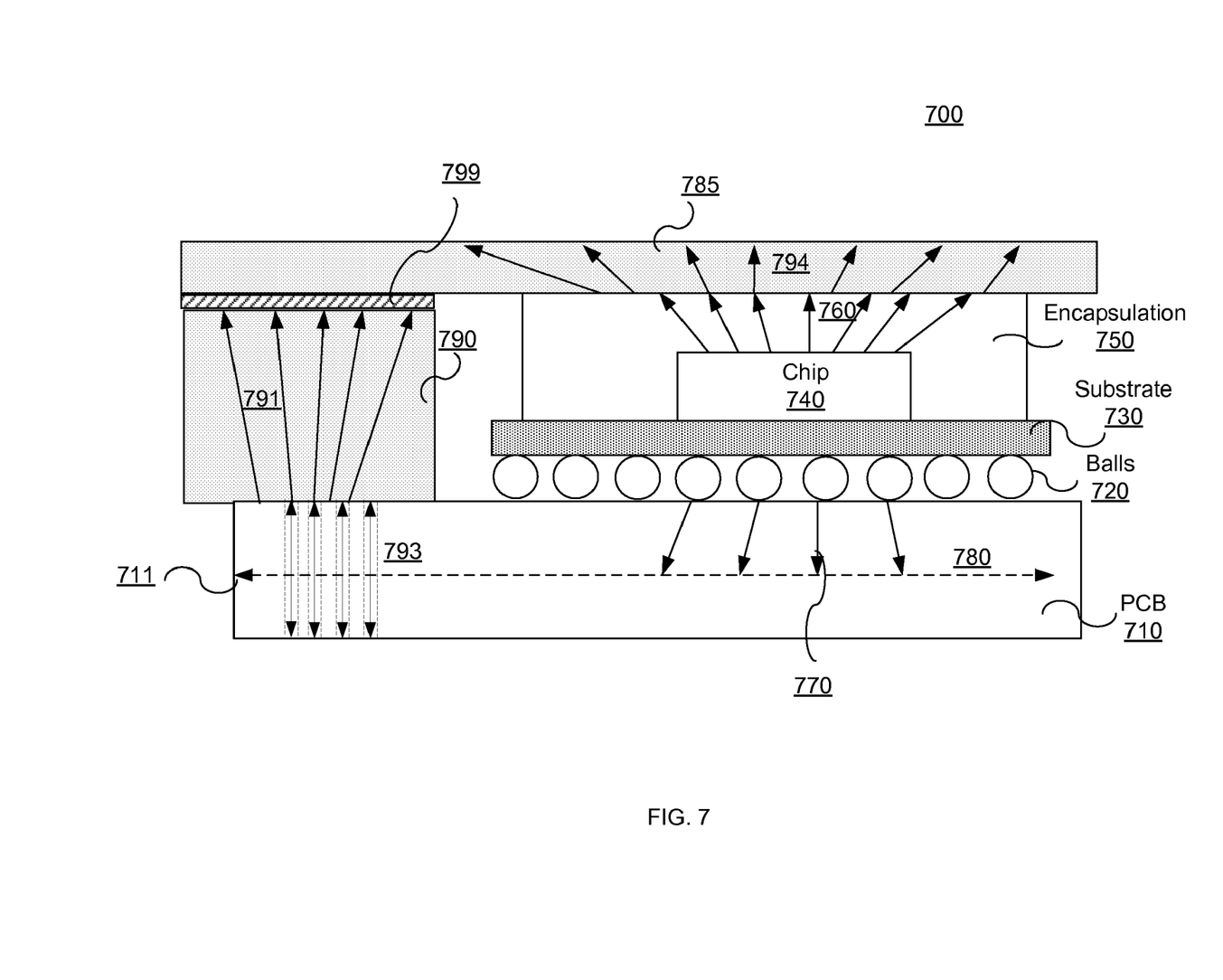
FIG. 7 is a block diagram illustrating a thermally enhanced memory module 700 according to an embodiment of the invention.

FIG. 7 illustrates a thermally enhanced memory module 700 according to an embodiment of the invention. Memory module 700 is similar to memory module 500, except that in memory module 700, surface heat spreader 785 and PCB substrate heat spreader 790 are stacked. Optionally, a gap filler 799 is placed between the two heat spreaders 790 and 785 to provide a thermally conductive path between surface heat spreader 785 and PCB substrate heat spreader 790.

Figure 8:
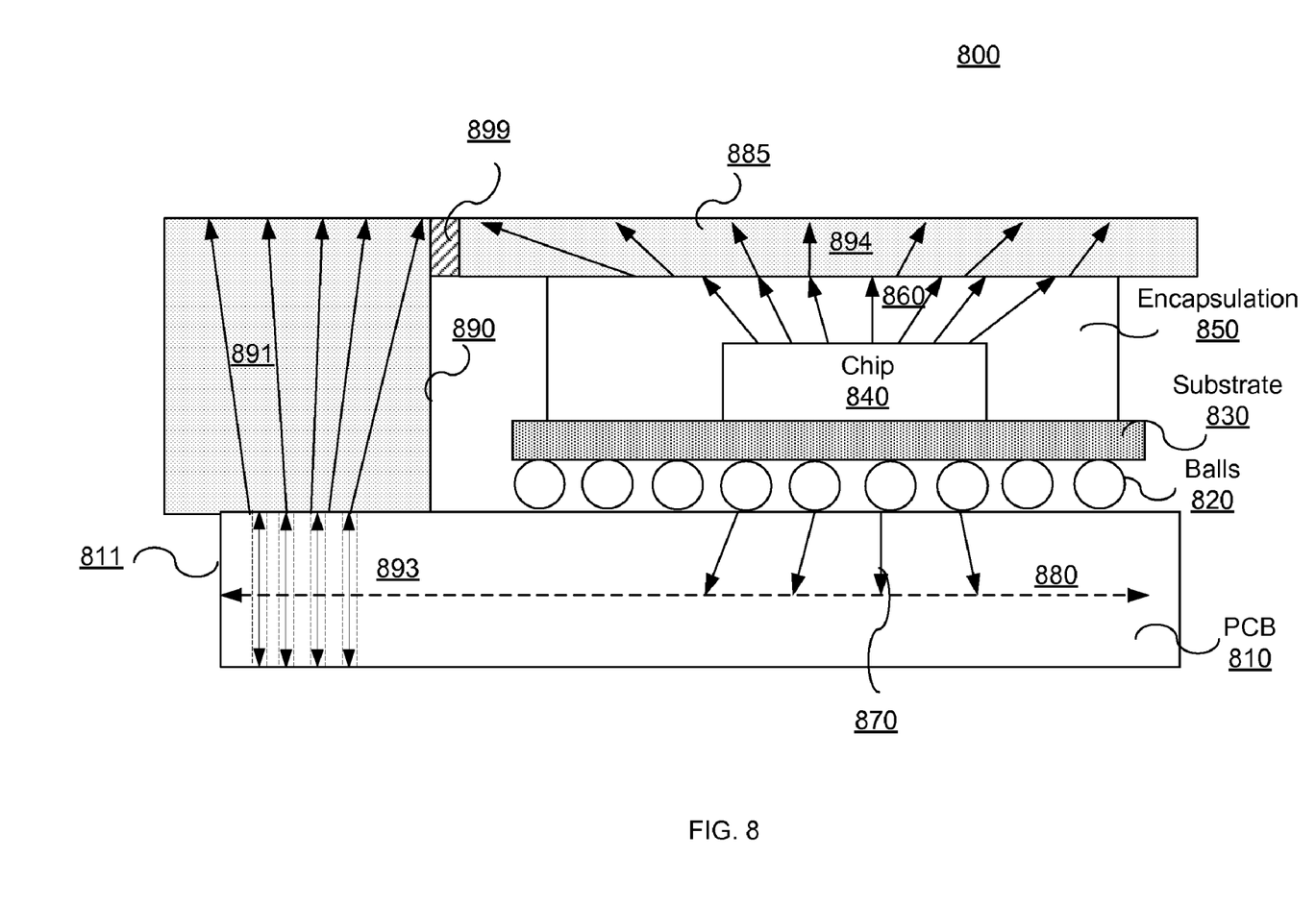
FIG. 8 is a block diagram illustrating a thermally enhanced memory module 800 according to an embodiment of the invention.

FIG. 8 illustrates a thermally enhanced memory module 800 according to an embodiment of the invention. Module 800 is similar to module 700, except that in module 800, surface heat spreader 885 and PCB substrate heat spreader 890 are segregated. Optionally, a gap filler 899 is placed between the two heat spreaders 890 and 885 to provide a thermally conductive path between surface heat spreader 885 and PCB substrate heat spreaders 890.

Figure 9A:
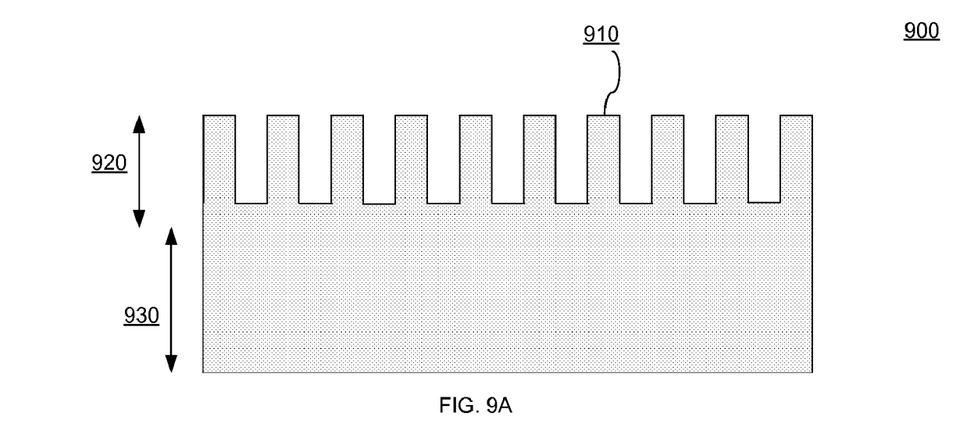
FIGS. 9A-9B are diagrams illustrating slits made in substrate heat spreader coupled to a memory module.

FIG. 9A illustrates a substrate heat spreader 900 according to an embodiment of the invention. Substrate heat spreader 900 has two portions—a base portion 930 and a portion 920 having a "pin fin" style. Portion 920 has multiple fins 910 extending laterally from the base 930. Fins 910 resemble comb-like tines. The fins 910 provide further surface area improvements to further increase heat dissipation. Also, the fins 910 provide improved airflow through a memory device when either crossflow (i.e. directed towards the side of memory module) forced air impingement or "downflow" (i.e., directed towards the top of the module from above) forced air impingement exist. In one embodiment of the invention, downflow air impingement over the top of thermally enhanced memory modules is provided by a fan unit (not shown) that can be mounted above a memory module.

Figure 9B:
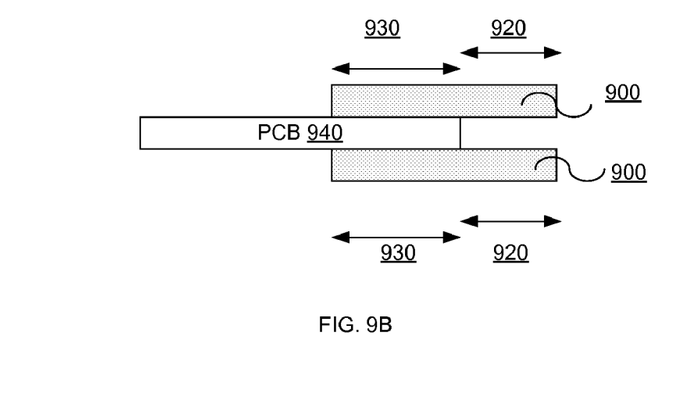

In one embodiment, as illustrated by FIGS. 9A and 9B, first portion 920 is a portion that extends above a top edge of PCB 940 onto which substrate heat spreader 900 is mounted. Second non-finned portion 930 of substrate heat spreader 900 is mounted directly onto PCB 940 of memory device.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Further, it should be appreciated that figures are not drawn to scale.

What is claimed is:

1. A method of thermally enhancing a memory module, the memory module having a substrate, the substrate comprising a plurality of electrical planes, the method comprising:

extending a first of the plurality of electrical planes of the substrate;

providing a thermal connection between a top surface plane of the substrate and the first electrical plane, wherein the top surface plane of the substrate is one on which one or more memory devices of a first plurality of memory devices are mounted;

coupling a first thermal management structure to the top surface plane of the substrate and to the thermal connection, wherein the thermal connection comprises thermal vias; and coupling a second thermal management structure to a bottom surface plane of the substrate, wherein the bottom surface plane of the substrate is one on which one or more memory devices of a second plurality of memory devices are mounted, the thermal connection connecting the bottom surface plane of the substrate to the first electrical plane, the second thermal management structure also coupled to the thermal connection.

2. The method of claim 1, wherein the first thermal management structure and the second thermal management structure are heat spreaders.

3. The method of claim 1, wherein the first thermal management structure and the second thermal management structure have a plurality of fins extending laterally from a base.

4. The method of claim 1, further comprising:
   further coupling the first thermal management structure to a top surface of the memory module; and
   further coupling the second thermal management structure to a bottom surface of the memory module.

5. The method of claim 1, further comprising:
   coupling a third thermal management structure to a top surface of the memory module, on top of the one or more memory devices of the first plurality of memory devices; and
   coupling a fourth thermal management structure to a bottom surface of the memory module, on top of the one or more memory devices of the second plurality of memory devices.

6. The method of claim 5, further comprising:
   placing a gap filler between the first thermal management structure and the third thermal management structure.

7. A system, comprising:
   a memory module, the memory module having:
      a substrate, the substrate comprising a first extended electrical plane, and a thermal connection between a top surface plane of the substrate and the first extended electrical plane;
      one or more memory devices of a first plurality of memory devices mounted on the top surface plane of the substrate;
   a first thermal management structure, the first thermal management structure coupled to the top surface plane of the substrate, the first thermal management structure also coupled to the thermal connection, wherein the thermal connection comprises thermal vias;
   a second thermal management structure coupled to a bottom surface plane of the substrate, the second thermal management structure also coupled to the thermal connection; and
   one or more memory devices of a second plurality of memory devices mounted on the bottom surface plane of the substrate.

8. The system of claim 7, wherein the first thermal management structure and the second thermal management structure are heat spreaders.

9. The system of claim 7, the first thermal management structure and the second thermal management structure further comprising:
   a plurality of fins extending laterally from a base.

10. The system of claim 7, wherein
    the first thermal management structure is further coupled to a top surface of the memory module, and
    the second thermal management structure is further coupled to a bottom surface of the memory module.

11. The system of claim 8, further comprising:
    a third thermal management structure coupled to a top surface of the memory module, on top of the one or more memory devices of the first plurality of memory devices; and
    a fourth thermal management structure coupled to a bottom surface of the memory module, on top of the one or more memory devices of the second plurality of memory devices.

12. The system of claim 11, further comprising:
    a gap filler between the first thermal management structure and the third thermal management structure.

* * * * *